US 8,987,877 B2
United States Patent
Minamio et al.

(10) Patent No.: US 8,987,877 B2
(45) Date of Patent: Mar. 24, 2015

(54) SEMICONDUCTOR DEVICE

(71) Applicant: Panasonic Corporation, Kadoma-shi, Osaka (JP)

(72) Inventors: Masanori Minamio, Osaka (JP); Zyunya Tanaka, Osaka (JP); Shin-ichi Ijima, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/280,244

(22) Filed: May 16, 2014

(65) Prior Publication Data
US 2014/0264801 A1 Sep. 18, 2014

Related U.S. Application Data

(62) Division of application No. 13/637,618, filed as application No. PCT/JP2011/005865 on Oct. 20, 2011, now abandoned.

(30) Foreign Application Priority Data

Oct. 21, 2010 (JP) .................. 2010-236097

(51) Int. Cl.
*H01L 23/495* (2006.01)
*H01L 23/433* (2006.01)
(Continued)

(52) U.S. Cl.
CPC ...... *H01L 23/49537* (2013.01); *H01L 23/4334* (2013.01); *H01L 23/49541* (2013.01); *H01L 23/49562* (2013.01); *H01L 23/49575* (2013.01); *H01L 2224/32245* (2013.01);
(Continued)

(58) Field of Classification Search
CPC . H01L 23/48; H01L 23/482; H01L 23/49568; H01L 23/49575; H01L 23/3107; H01L 23/4334; H01L 23/4951; H01L 23/49537; H01L 2224/48465; H01L 2224/48464; H01L 2224/49113
USPC .................. 257/724, 696, 69–695, E23.052, 257/E23.042
See application file for complete search history.

(56) References Cited

U.S. PATENT DOCUMENTS 5,792,676 A * 8/1998 Masumoto et al. ........... 438/111
5,892,278 A * 4/1999 Horita et al. .................. 257/706
(Continued)

FOREIGN PATENT DOCUMENTS

CN 1467828 1/2004
CN 1993215 7/2004
(Continued)

*Primary Examiner* — Michael Trinh
(74) *Attorney, Agent, or Firm* — Hamre, Schumann, Mueller & Larson, P.C.

(57) ABSTRACT

A semiconductor device of the present invention comprises: an outer package; a first lead frame including a first relay lead, a first die pad with a power element mounted thereon, and a first external connection lead which has an end protruding from the outer package; and a second lead frame including a second relay lead, a second die pad with a control element mounted thereon, and a second external connection lead which has an end protruding from the outer package, wherein the first die pad and the second die pad or the first external connection lead and the second relay lead are joined to each other at a joint portion, and an end of the second relay lead extending from a joint portion with the first relay lead is located inside the outer package.

9 Claims, 16 Drawing Sheets

(51) Int. Cl.
  *H01L 23/31* (2006.01)
  *H01L 21/56* (2006.01)
  *B29C 45/14* (2006.01)
  *H01L 23/367* (2006.01)
  *H01L 23/00* (2006.01)

(52) U.S. Cl.
  CPC ............... *H01L 2224/48091* (2013.01); *H01L 2224/48247* (2013.01); *H01L 2224/49171* (2013.01); *H01L 24/48* (2013.01); *H01L 24/49* (2013.01); *H01L 2924/01079* (2013.01); *H01L 2924/13091* (2013.01); *H01L 2224/73265* (2013.01); *H01L 2224/48137* (2013.01); *H01L 2224/48257* (2013.01); *H01L 2224/48464* (2013.01); *H01L 2224/4903* (2013.01); *H01L 2224/45124* (2013.01); *H01L 2924/13055* (2013.01); *H01L 2224/45144* (2013.01); H01L 23/3107 (2013.01); H01L 21/565 (2013.01); H01L 21/568 (2013.01); B29C 45/14221 (2013.01); B29C 45/14655 (2013.01); *H01L 2924/3025* (2013.01); H01L 23/367 (2013.01); H01L 24/66 (2013.01); *H01L 2924/1306* (2013.01); *H01L 2924/1305* (2013.01)

USPC .......... 257/672; 257/690; 257/692; 257/787; 257/E23.052

(56) References Cited

U.S. PATENT DOCUMENTS

| | | | |
|---|---|---|---|
| 6,291,880 | B1 | 9/2001 | Ogawa et al. |
| 6,603,197 | B1 * | 8/2003 | Yoshida et al. ............... 257/676 |
| 7,012,321 | B2 | 3/2006 | Masuda et al. |
| 7,456,499 | B2 | 11/2008 | Loh et al. |
| 8,057,723 | B2 | 11/2011 | Takeda et al. |
| 2008/0029860 | A1 | 2/2008 | Gao |

FOREIGN PATENT DOCUMENTS

| | | |
|---|---|---|
| EP | 0767494 | 4/1997 |
| JP | 5-190734 | 7/1993 |
| JP | 9-102571 | 4/1997 |
| JP | 11-233712 | 8/1999 |
| JP | 2004-22601 | 1/2004 |
| JP | 2005-150595 | 6/2005 |

* cited by examiner

F I G. 1
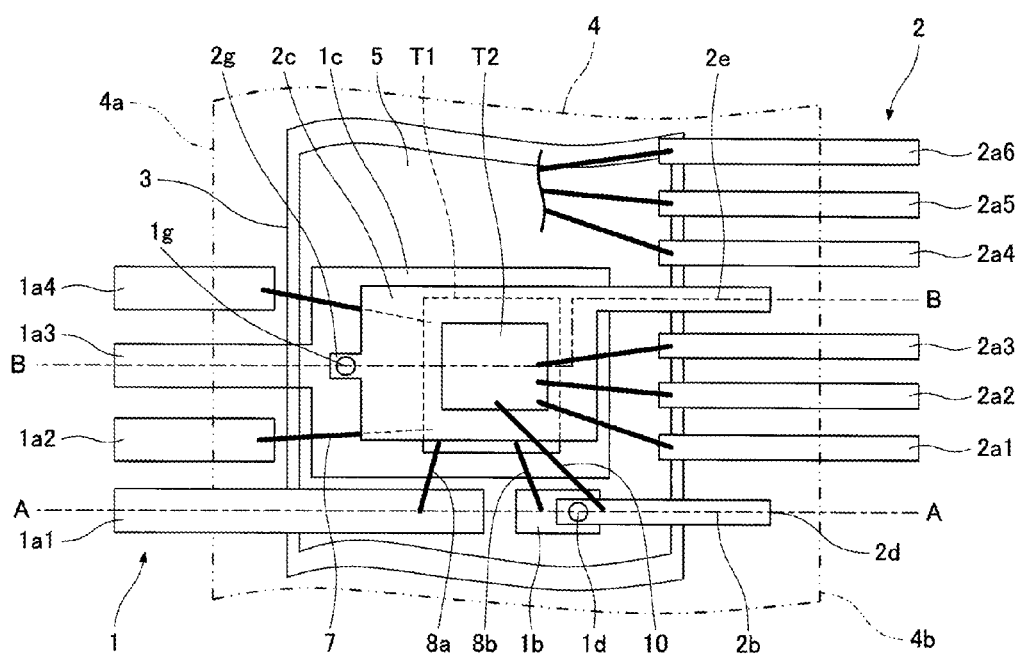

F I G. 1 2
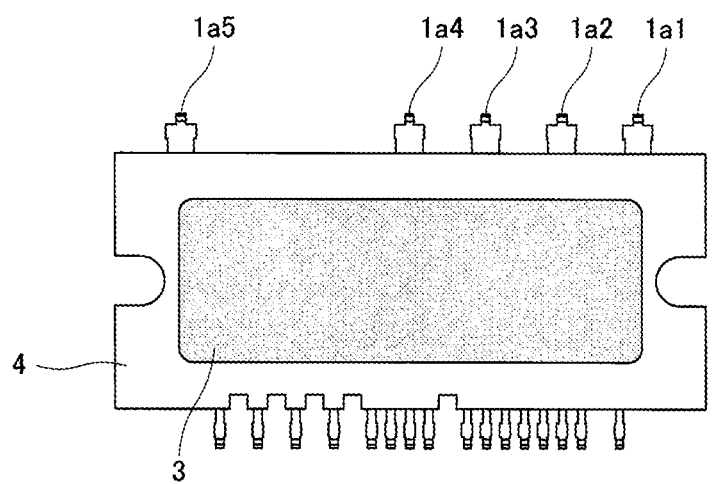

F I G. 2 0
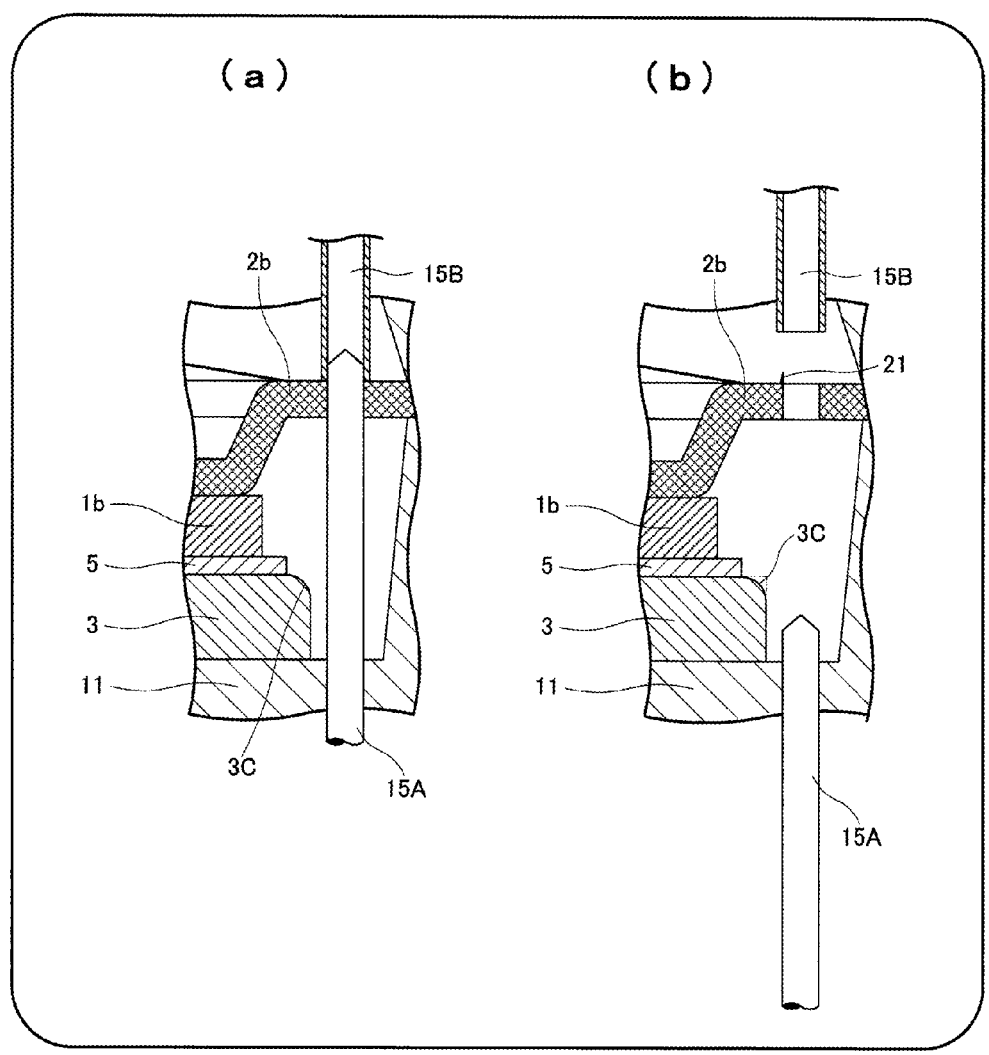

F I G. 2 1     PRIOR ART
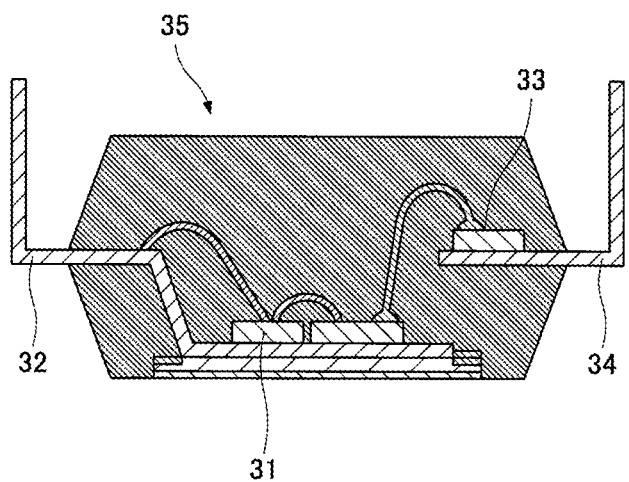

SEMICONDUCTOR DEVICE

TECHNICAL FIELD

The present invention relates to a semiconductor device such as a semiconductor package in which semiconductor elements are molded with resin.

BACKGROUND ART

As inverter controllers have been required to be reduced in size and weight, resin molding semiconductor devices included therein have been also reduced in size and weight.

The resin molding semiconductor devices include, as shown in FIG. 21, a semiconductor device 35 in which a first lead frame 32 with a power element 31 mounted thereon and a second lead frame 34 with a control element 33 mounted thereon are three-dimensionally disposed and molded with resin, thereby reducing the size and weight of the semiconductor device 35 (for example, see Patent Literature 1).

CITATION LIST

Patent Literature

Patent Literature 1: Japanese Patent Application Laid-Open Publication No. 2005-150595

SUMMARY OF INVENTION

Technical Problem

In the resin molding semiconductor device of the prior art, however, large amounts of electromagnetic wave noise are easily caused since the power element performs a large-current, high-frequency switching operation. The electromagnetic wave noise may affect the control element and thus cause an operational error of the semiconductor device. The operational error due to the electromagnetic wave noise decreases the reliability of the semiconductor device. The occurrence of such an operational error may increase when a distance between the power element and the control element in the semiconductor device is reduced.

In the case where a lead having an end surface exposed to the outside air is provided, moisture and so on may enter the semiconductor device from the end surface, thereby reducing the reliability of the semiconductor device.

The present invention has been devised to solve the above-described problems of the related art. An object of the present invention is to provide a semiconductor device with higher reliability than the semiconductor device of the related art.

Solution to Problem

In order to solve the above-described problems, a semiconductor device comprises: a resin outer package; a first lead frame including first relay leads, a first die pad with a first semiconductor chip mounted thereon, and first external connection leads which each have an end protruding from the outer package; and a second lead frame including second relay leads, a second die pad with a second semiconductor mounted thereon, and second external connection leads which each have an end protruding from the outer package, wherein the first die pad and the second die pad or the first external connection lead and the second relay lead are joined to each other at a joint portion, and at least one of the end of the second relay lead extending from a joint portion with the first relay lead and the end of the suspended lead of the second die pad is located inside the outer package.

Furthermore, a method for manufacturing a semiconductor device, comprises: preparing a first lead frame including first relay leads, a first die pad with a first semiconductor chip mounted thereon, and first external connection leads, and a second lead frame including second relay leads, a second die pad with a second semiconductor chip mounted thereon, and second external connection leads; joining the first die pad and the second die pad or the first relay lead and the second relay lead; cutting off the second relay lead of the second lead frame extending from a joint portion with the first relay lead or the suspended lead of the second die pad inside an area where a semiconductor package is to be molded as a resin outer package; and molding with resin the end of the cut-off second lead frame or the end of the cut-off suspended lead disposed inside molds to form the outer package.

Advantageous Effects of Invention

According to the present invention, a semiconductor device with high reliability can be achieved.

BRIEF DESCRIPTION OF DRAWINGS

FIG. 1 is a plan view of the interior of a semiconductor device according to a first embodiment of the present invention.

FIG. 12 is a plan view of the bottom surface of the semiconductor device including a first lead frame and a second lead frame according to the first embodiment.

FIG. 20(a) is an enlarged view of the principal part in FIG. 19, and FIG. 20(b) is an explanatory diagram illustrating a warped portion 21 formed on a cut surface.

FIG. 21 is a cross sectional view of a semiconductor device according to the prior art.

DESCRIPTION OF EMBODIMENTS

First Embodiment

Figure 2:
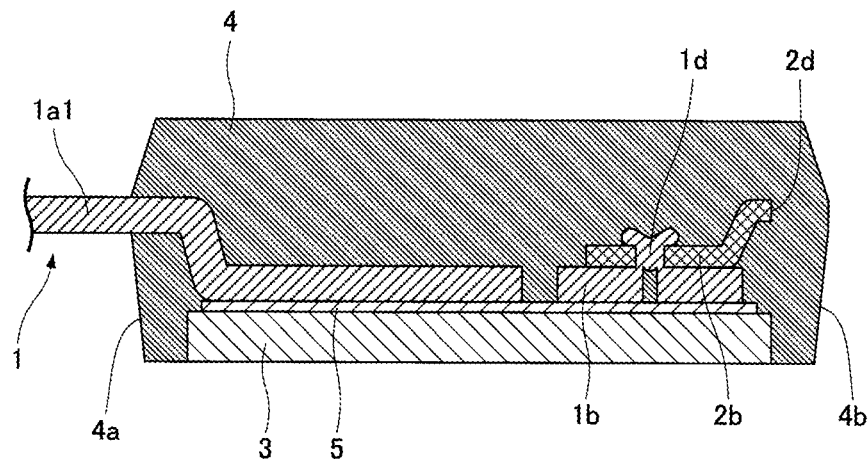
FIG. 2 is a cross sectional view taken along the line A-A in FIG. 1 of the semiconductor device according to the first embodiment.
Figure 3:
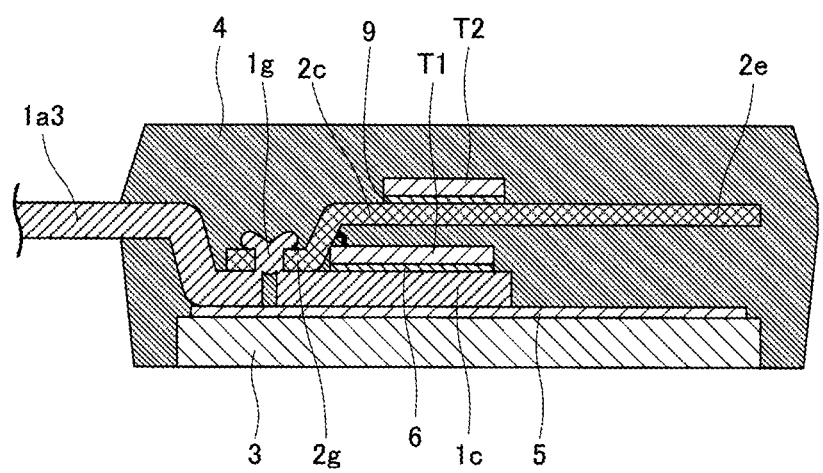
FIG. 3 is a cross sectional view taken along the line B-B in FIG. 1 of the semiconductor device according to the first embodiment.

FIGS. 1 to 3 each show a resin molding semiconductor device according to a first embodiment of the present invention.

FIG. 1 is a plan view of the interior of the resin molding semiconductor device according to the first embodiment. FIG. 2 is a cross sectional view taken along the line A-A in FIG. 1. FIG. 3 is a cross sectional view taken along the line B-B in FIG. 1.

The resin molding semiconductor device includes a power element T1 which is an example of a first semiconductor chip, a first lead frame 1 with the power element 1 fixed thereto, a control element T2 which is an example of a second semiconductor chip, a second lead frame 2 with the control element T2 fixed thereto, and a heat dissipation plate 3. Further, the resin molding semiconductor device is a semiconductor package in which the power element T1, the first lead frame 1, the control element T2, the second lead frame 2, and the heat dissipation plate 3 are molded with resin by a resin outer package 4. Multiple first external connection leads 1a1, 1a2, 1a3, and 1a4 of the first lead frame 1 are drawn out of the outer package 4 from one longer side 4a of the outer package 4 of the semiconductor device. In addition, multiple second external connection leads 2a1, 2a2, 2a3, 2a4, 2a5, and 2a6 of the second lead frame 2 are drawn out of the outer package 4 from another longer side 4b of the outer package 4 of the semiconductor device. The outer package 4 is made of thermosetting resin such as epoxy resin. The outer package 4 integrates the first lead frame 1 and the second lead frame 2, and protects the power element T1 and the control element T2. Although four first external connection leads and six second external connection leads are shown in FIG. 1 and so on for the sake of simplicity, the number of external connection leads is not limited to these in semiconductor devices to which the present invention is applicable. Furthermore, a plurality of power elements T1 and control elements T2 may be present in a single semiconductor device.

Incidentally, thermoplastic resin such as silicone resin may be used as a material for the outer package 4 in addition to thermosetting resin such as epoxy resin.

The first lead frame 1 is composed of a material having high electrical conductivity such as copper (Cu). The first lead frame 1 includes the first external connection leads 1a1, 1a2, 1a3, and 1a4 which each have an end protruding from the outer package 4, a plurality of first relay leads 1b, and a first die pad 1c on which the power element T1 is mounted.

The second lead frame 2 is composed of a material having high electrical conductivity such as copper (Cu) and 42 Alloy. The second lead frame 2 includes the second external connection leads 2a1, 2a2, 2a3, 2a4, 2a5, and 2a6 which each have an end protruding from the outer package 4, a plurality of second relay leads 2b, and a second die pad 2c on which the control element T2 for controlling the power element T1 is mounted.

The heat dissipation plate 3 is composed of a metal having high thermal conductivity such as copper (Cu) and aluminum (Al). The heat dissipation plate 3 is molded such that the undersurface thereof is exposed from the outer package 4 to the outside of the semiconductor package. The first die pad 1c and the first relay leads 1b of the first lead frame 1 are fixed on the top surface of the heat dissipation plate 3 via an insulating sheet 5. The insulating sheet 5 is composed of, for example, an electrical insulating material with thermal conductivity and has a three-layer structure in which an electrical insulating layer is sandwiched by a plurality of adhesive layers.

The power element T1 is composed of, for example, an IGBT (insulated gate bipolar transistor) and a power MOSFET (metal-oxide-semiconductor field-effect transistor). The power element T1 is fixed to the top surface of the first die pad 1c with a brazing filler metal 6. As shown in FIG. 1, the bonding pad (not shown) of the power element T1 and the external connection leads 1a2 and 1a4 are electrically connected by wires 7. Further, the first external connection lead 1a1 and the bonding pad (not shown) of the power element T1 are electrically connected by a wire 8a. The first relay lead 1b and the bonding pad (not shown) of the power element T1 are electrically connected by a metal wire 8b. The wires 7, 8a, and 8b are, for example, aluminum (Al) wires made of a metal member such as aluminum (Al).

Incidentally, aluminum (Al) ribbons and copper (Cu) clips may be used for the wires 7, 8a, and 8b instead of aluminum wires. Aluminum ribbons and copper clips have larger cross-sectional areas than aluminum wires and have smaller wiring resistance values, thereby enabling a reduction in the power loss of the semiconductor device.

The control element T2 controls the power element T1, and includes, for example, a drive circuit, an overcurrent protection circuit, and so on. The control element T2 is fixed to the second die pad 2c by a joint portion 9. The joint portion 9 is made of, for example, silver (Ag) paste. The bonding pad (not shown) of the control element T2 and the second relay lead 2b are connected by a wire 10. The wire 10 is made of a metal material such as gold (Au).

The second die pad 2c with the control element T2 mounted thereon is disposed, as shown in FIGS. 2 and 3, above the power element T1 and substantially in parallel with the top surface of the power element T1. The second die pad 2c covers at least a part of the wire 7 of the power element T1. As a result, the second die pad 2c is disposed between the wire 7 as the output signal line of the power element T1 and the control element T2, in a vertical direction relative to the top surface of the power element T1. Therefore, in the structure of the first embodiment, electromagnetic noise generated in the wire 7 and spread to the control element T2 can be partly blocked out by the second die pad 2c. Consequently, the semiconductor device of the first embodiment can reduce the possibility of an operational error of the control element T2.

At least a part of the second die pad 2c, preferably the undersurface of the second die pad 2c, may be plated with a magnetic material such as nickel (Ni). Thus, electromagnetic noise generated in the power element T1 can be absorbed by the plated layer, further reducing the possibility of an operational error of the control element T2.

In the first embodiment, the first relay lead 1b of the first lead frame 1 and the second relay lead 2b of the second lead frame 2 are joined to each other with caulking, and are thus electrically connected.

In the first embodiment, the second lead frame 2 is disposed so as to cover at least a part of the first lead frame 1. Therefore, electromagnetic noise generated in the power element T1 can be blocked out by the second lead frame 2 disposed on the undersurface of the control element T2. As a result, the amount of electromagnetic noise reaching the control element T2 is reduced. Thus, the possibility of an operational error of the control element T2 can be reduced, thereby increasing the reliability of an operation of the control element T2.

In addition, in the first embodiment, as shown FIGS. 1 and 2, the first external connection lead 1a1 and the second relay lead 2b are coupled and joined to each other with caulking (a caulking portion 1d). Further, in the first embodiment, as shown in FIGS. 1 and 3, the first die pad 1c and a projecting portion 2g of the second die pad 2c are coupled, joined, and connected to each other with caulking (a caulking portion 1g). The coupled and joined portion is a joint portion (in the case of caulking, the caulking portion 1d or the caulking portion 1g).

As will be specifically described later, an end 2d of the second relay lead 2b having one end connected to the first external connection lead 1a1 with caulking and the end surface of a suspended lead 2e of the second die pad 2c are cut off before molding resin is injected into the outer package 4, and are immersed in the resin of the outer package 4. In other words, the ends (end surfaces) of the second relay lead 2b and the suspended lead 2e are not exposed to the outside of the outer package 4 in the semiconductor device of the first embodiment.

Next, the steps of manufacturing the semiconductor device according to the first embodiment will be described referring to FIGS. 4 to 13. Incidentally, FIGS. 5 to 11 are cross-sectional views taken along the line A-A in FIG. 1 in the respective manufacturing steps.

Figure 4:
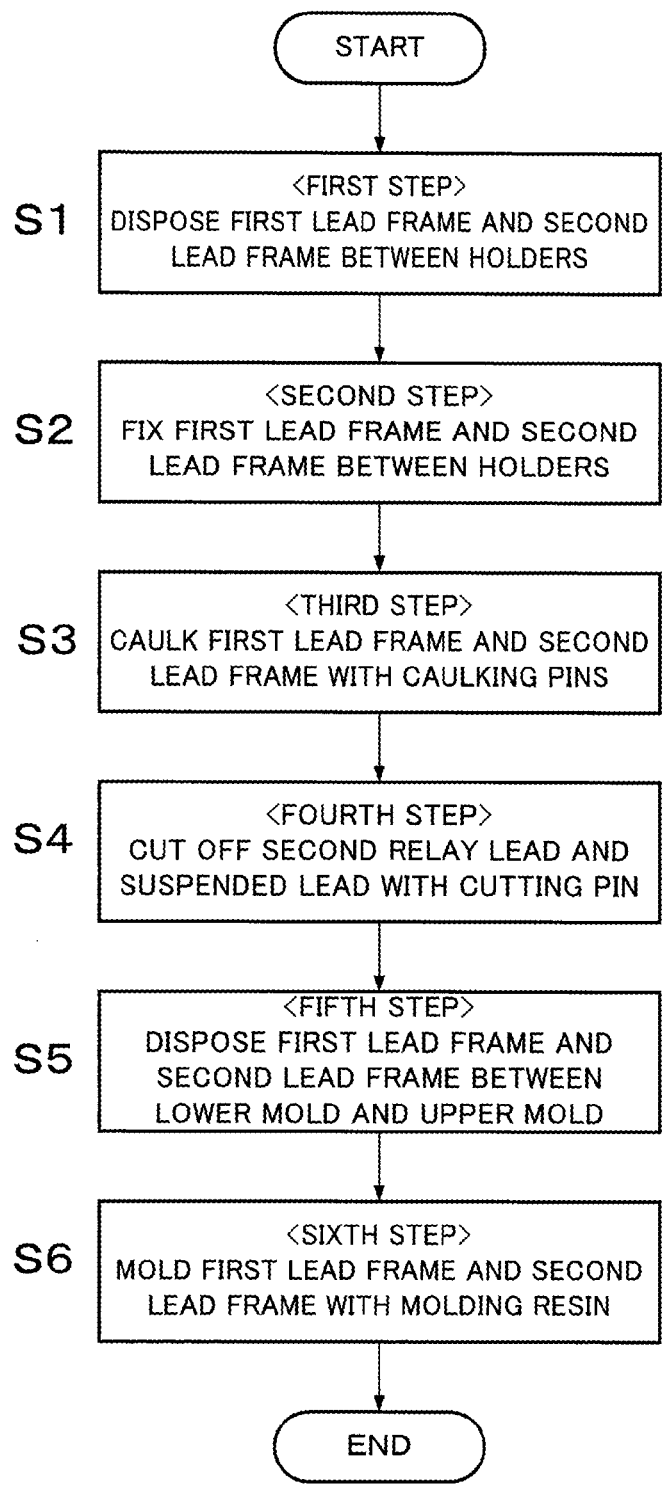
FIG. 4 is a flow chart illustrating the manufacturing process of the semiconductor device according to the first embodiment.

FIG. 4 is a flow chart showing the steps of manufacturing the semiconductor device according to the first embodiment.

Figure 5:
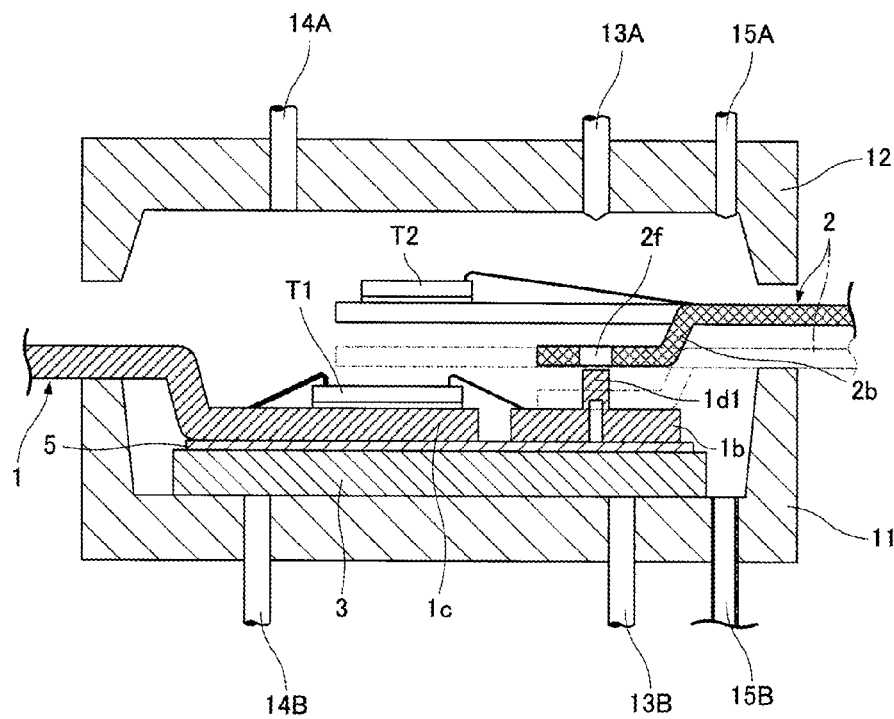
FIG. 5 is a cross sectional view of the semiconductor device in a first step according to the first embodiment.

In FIG. 4, in step S1 as a first step, the first lead frame 1 and the second lead frame 2 are prepared and then disposed between holders 11 and 12 shown in FIG. 5.

Next, in step S2 as a second step, the first lead frame 1 and the second lead frame 2 are fixed by the holders 11 and 12.

Next, in step S3 as a third step, the first lead frame 1 and the second lead frame 2 are joined to each other by caulking pins 13A and 13B.

Next, in step S4 as a fourth step, the second relay lead 2b of the second lead frame 2 and the suspended lead 2e are interposed between a cutting pin 15A and a die 15B, and are thus caulked and cut off.

In step S5 as a fifth step, the first lead frame 1 and the second lead frame 2 subjected to the fourth step are moved from between the holders 11 and 12 to between a lower mold 16 and an upper mold 17, and are disposed therebetween.

In step S6 as a sixth step, the first lead frame 1 and the second lead frame 2 are molded with molding resin between the lower mold 16 and the upper mold 17, so that the outer package 4 is formed. Thereafter, the outer package 4 is removed from between the molds, thereby obtaining the semiconductor device according to the first embodiment.

FIG. 5 shows the state of the semiconductor device in the first step in FIG. 4.

First, as shown in FIG. 5, the heat dissipation plate 3 with the insulating sheet 5 temporarily bonded thereto is mounted on the holder 11 between the holders 11 and 12. Further, the first lead frame 1 is mounted on the heat dissipation plate 3 such that the undersurface of the first die pad 1c and the undersurface of the first relay lead 1b of the first lead frame 1 contact the insulating sheet 5.

At this point, the caulking pin 13B, a press pin 14B, and the die 15B are provided on the holder 11. Further, the caulking pin 13A corresponding to the caulking pin 13B, a press pin 14A corresponding to the press pin 14B, and the cutting pin 15A corresponding to the die 15B are provided on the holder 12.

A protrusion 1d1 projecting upward is formed by bending on the leading end of the first relay lead 1b. A metal-plated layer is formed on the surface of the protrusion 1d1. The metal-plated layer is made of a metal with low contact resistance such as nickel (Ni) or gold (Au).

Subsequently, a through hole 2f of the second relay lead 2b of the second lead frame 2 is aligned with the protrusion 1d1 of the first relay lead 1b. Specifically, the second lead frame 2 is mounted on the first lead frame 1 as indicated by the dashed line after aligning the through hole 2f with the protrusion 1d1. That is, the second lead frame 2 is mounted such that the protrusion 1d1 of the first relay lead 1b is inserted into the through hole 2f of the second relay lead 2b. At this point, a metal-plated layer is formed on the inner wall and the top surface periphery of the through hole 2f. The metal-plated layer is made of a metal with low contact resistance such as nickel (Ni) or gold (Au).

Here, the configurations of the first lead frame 1 and the second lead frame 2 will be described in reference to the FIGS. 14 to 16.

Figure 14:
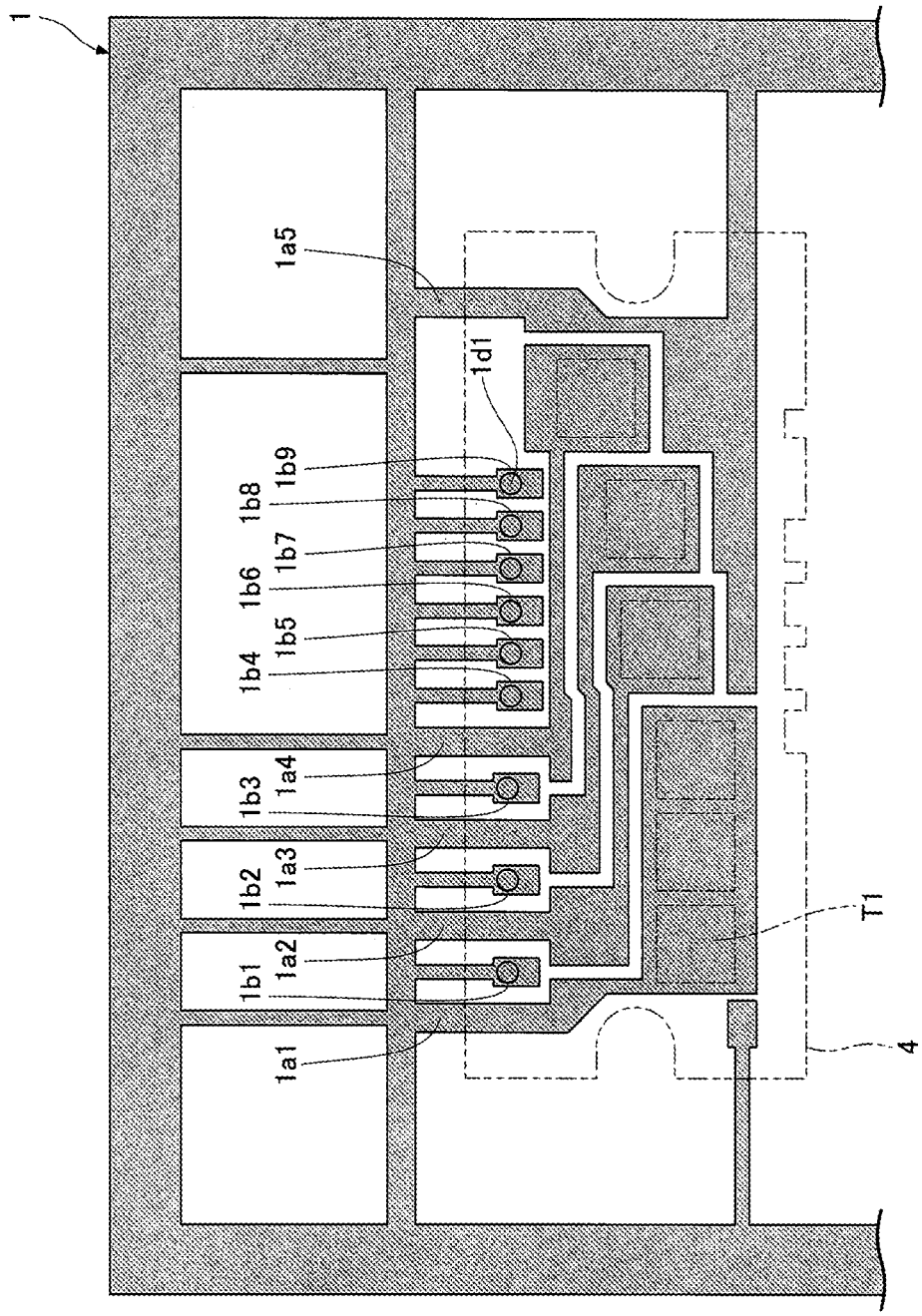
FIG. 14 is a plan view of the first lead frame used for the resin molding semiconductor device according to the first embodiment.

FIG. 14 shows a specific example of the first lead frame 1. The position of the outer package 4 indicated by the two-dot chain line is to be molded with resin. Reference numerals 1a1 to 1a5 correspond to the first external connection leads 1a1 to 1a4 shown in FIGS. 1 to 3. In FIGS. 1 to 3, the first relay lead 1b is disposed in the proximity of the draw-out side of the second lead frame 2 (the longer side 4b of the outer package 4). However, in the specific example of FIG. 7, first relay leads 1b1 to 1b9 are disposed on the same side as the first external connection leads 1a1 to 1a5 in the specific example of FIG. 7. In the semiconductor device of the first embodiment, as shown in FIG. 14, the first relay leads 1b4 to 1b9 are concentratedly disposed between the first external connection leads 1a4 and lay requiring a creepage distance for insulation therebetween especially when the semiconductor device is obtained.

Figure 15:
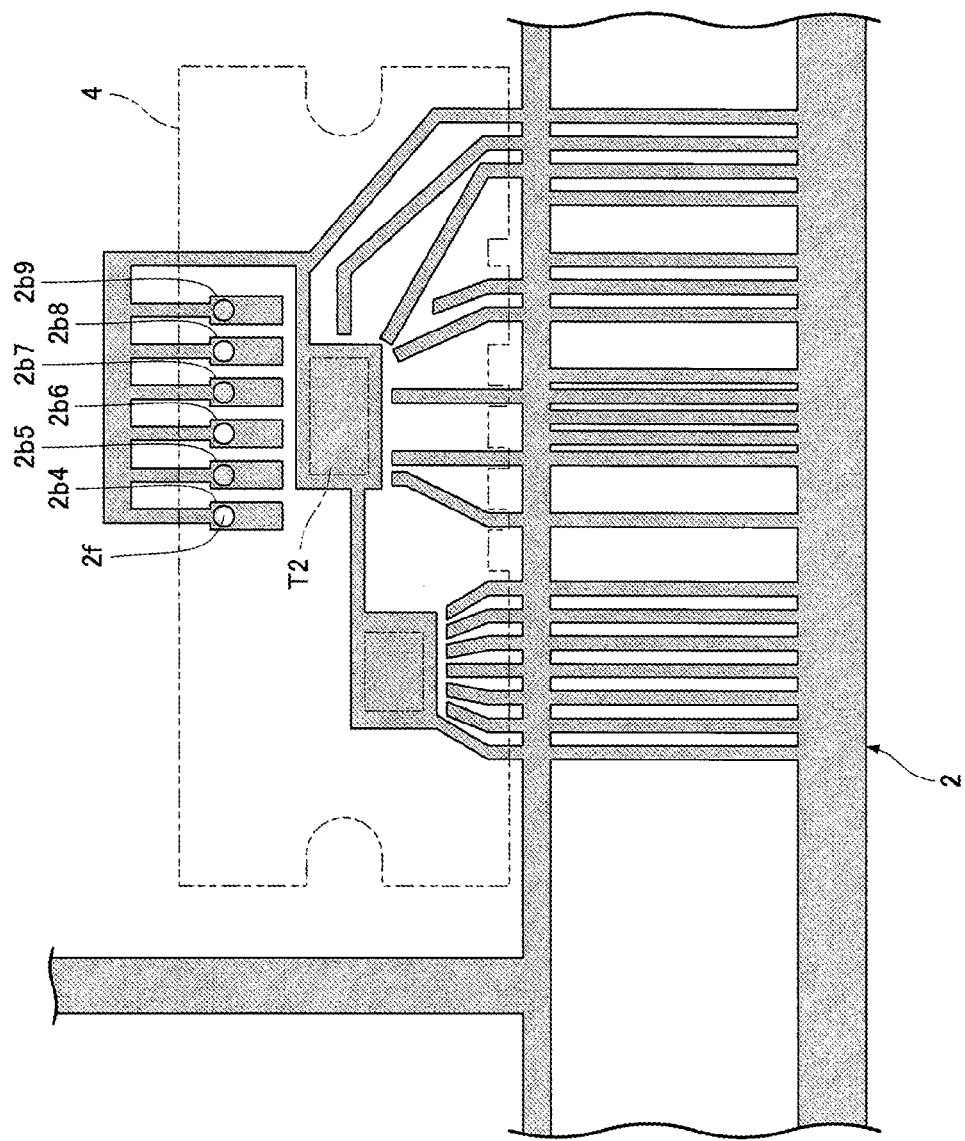
FIG. 15 is a plan view of the second lead frame used for the resin molding semiconductor device according to the first embodiment.
Figure 16:
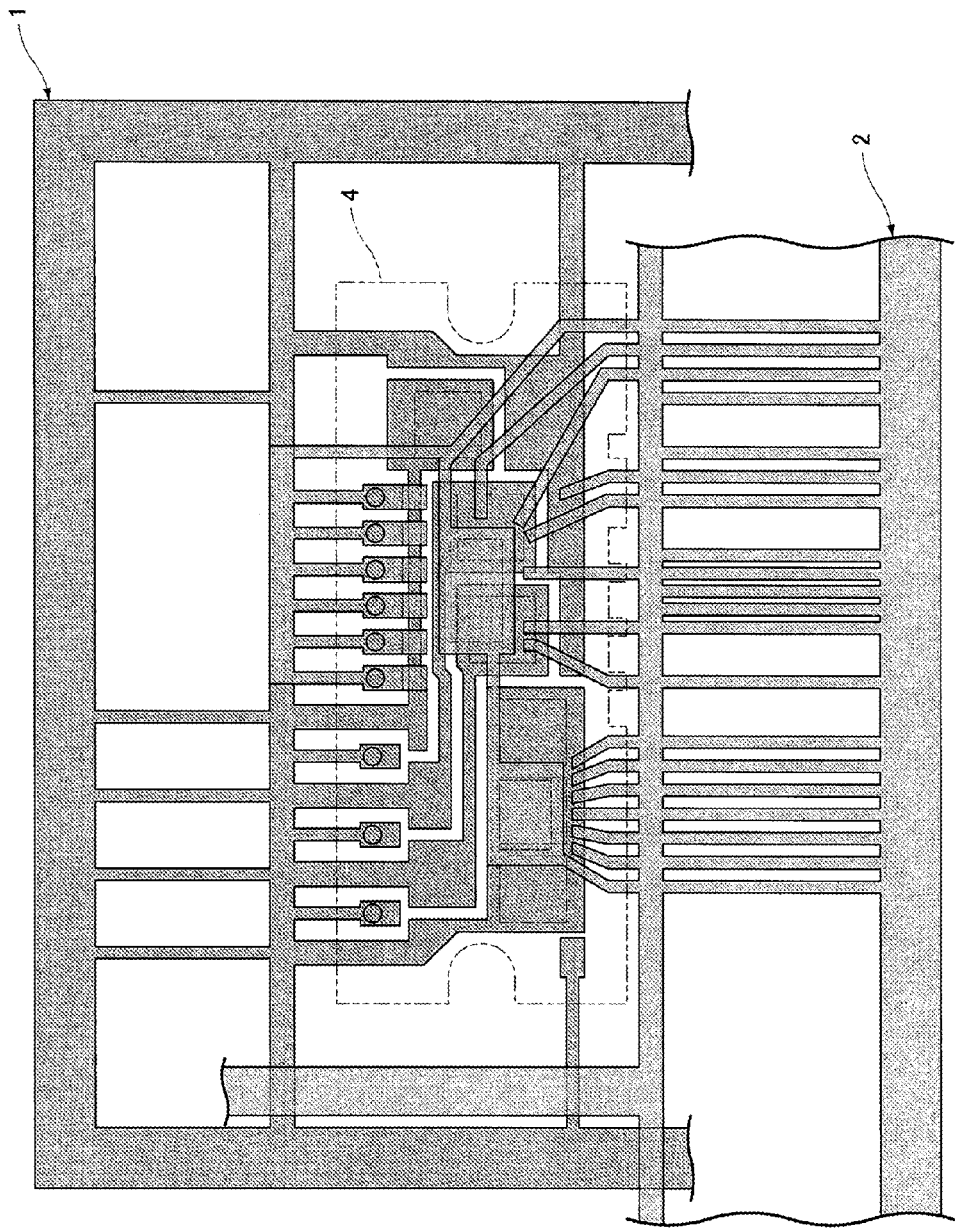
FIG. 16 is a plan view illustrating the state of the stacked first and second lead frames according to the first embodiment.

FIG. 15 shows a specific example of the second lead frame 2 to be combined with the first lead frame 1 shown in FIG. 14. In the second lead frame 2, second relay leads 2b4 to 2b9 are formed in positions corresponding to the first relay leads 1b4 to 1b9. FIG. 16 shows that the first lead frame 1 of FIG. 14 is combined with the second lead frame 2 of FIG. 15.

The first lead frame 1 and the second lead frame 2 are configured as described above.

Figure 6:
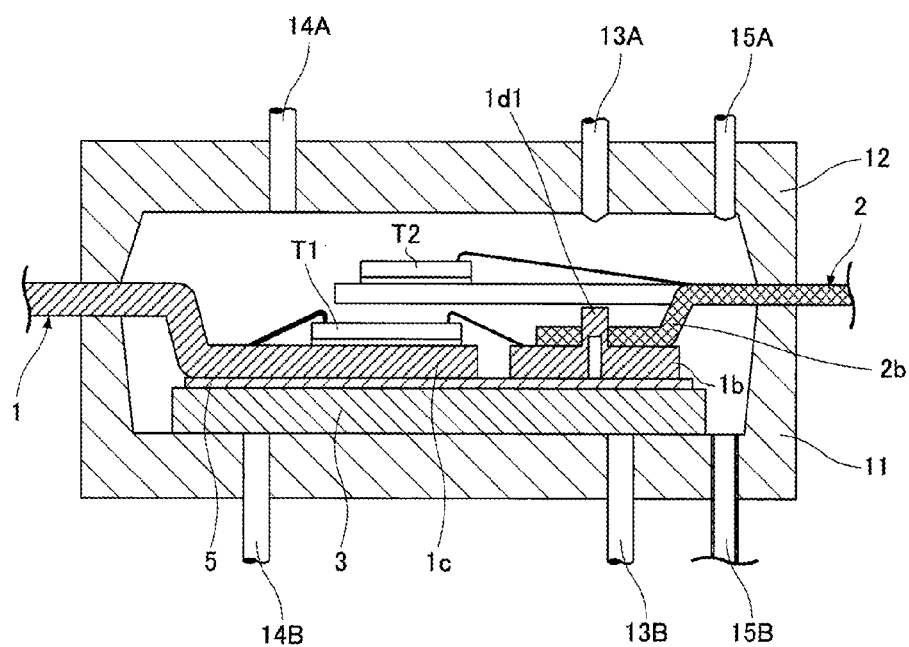
FIG. 6 is a cross sectional view of the semiconductor device in a second step according to the first embodiment.

FIG. 6 shows the state of the semiconductor device in the second step in FIG. 4.

As shown in FIG. 6, the holder 12 is lowered in a state in which the first lead frame 1 and the second lead frame 2 are aligned with each other, so that the first lead frame 1 and the second lead frame 2 are interposed, held, and fixed between the holders 11 and 12.

Figure 7:
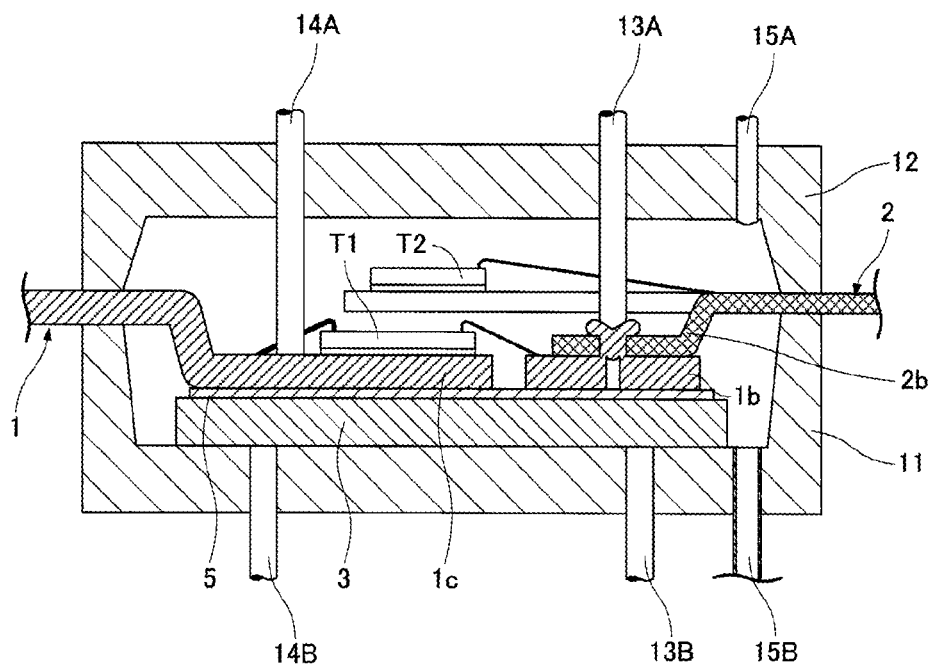
FIG. 7 is a cross sectional view of the semiconductor device in a third step according to the first embodiment.

FIG. 7 shows the state of the semiconductor device in the third step in FIG. 4.

As shown in FIG. 7, the press pin 14A and the caulking pin 13A are lowered in the state in which the first lead frame 1 and the second lead frame 2 are interposed and held between the holders 11 and 12. In the first embodiment, the press pin 14A is lowered at a faster speed than the caulking pin 13A. This is because the press pin 14A fixes the position of the first lead frame 1 by pressing before the caulking pin 13A caulks the protrusion 1d1 in the first embodiment. Further, in the state where the first lead frame 1 is fixed by the press pin 14A, the caulking pin 13A crushes the protrusion 1d1 of the first relay lead 1b to form the caulking portion 1d, so that the first lead frame 1 and the second lead frame 2 are joined to each other.

In the present embodiment, a protrusion 1g1 formed on the first die pad is also crushed (not shown). At this point, the first die pad 1c is pressed towards the heat dissipation plate 3 by the press pin 14A. The insulating sheet 5 is deformed by pressing with the press pin 14A, thereby absorbing a variation in the thickness of the first die pad 1c.

Figure 8:
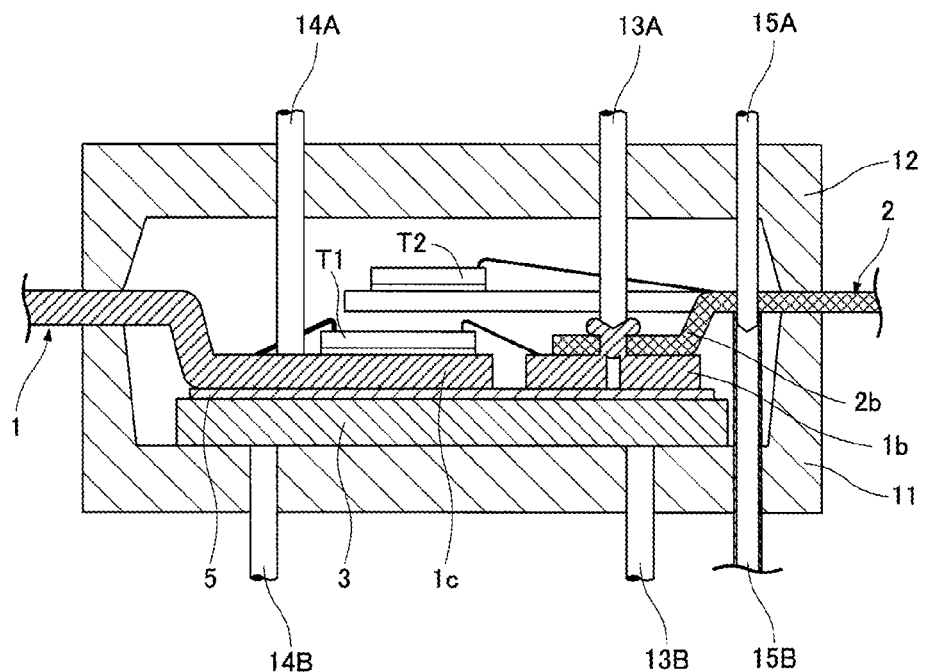
FIG. 8 is a cross sectional view of the semiconductor device in a fourth step according to the first embodiment.

FIG. 8 shows the state of the semiconductor device in the fourth step in FIG. 4.

As shown in FIG. 8, in the third step, the second relay lead 2b having the one end connected to the first relay lead 1b by the formed caulking portion 1d and the suspended lead 2e of the second die pad 2c are interposed and cut off between the cutting pin 15A and the die 15B. At this point, since the second relay lead 2b is held between the holders 11 and 12 by the caulking portion 1d, the second relay lead 2b can be cut off by the cutting pin 15A and the die 15B. Similarly, since the suspended lead 2e is held between the holders 11 and 12 by the caulking portion 1g, the suspended lead 2e can be cut off by the cutting pin 15A and the die 15B.

Figure 9:
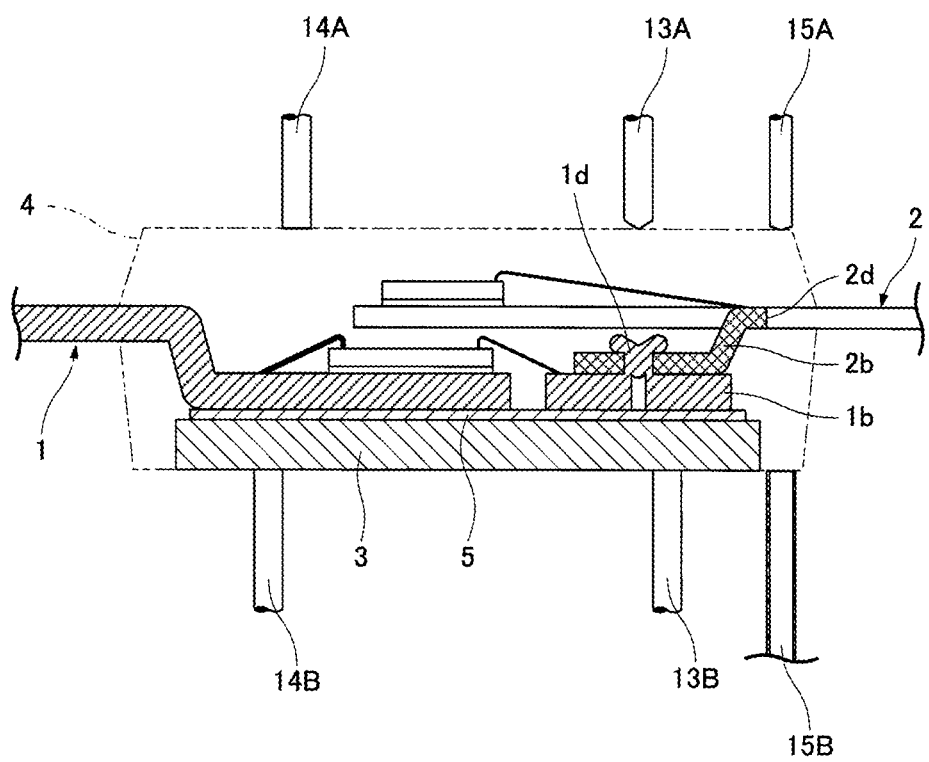
FIG. 9 shows the state of the semiconductor device after the completion of cutting off according to the first embodiment.

FIG. 9 shows the state of the semiconductor device without the holders 11 and 12 after cutting off. As shown in FIG. 9, a portion in the second lead frame 2 to be cut off by the cutting pin 15A and the die 15B is located inside an area (indicated by the two-dot chain line in FIG. 9) where the semiconductor package is to be molded with resin as the outer package 4, that is, inside the semiconductor package.

In the specific cases of the first lead frame 1 and the second lead frame 2 shown in FIGS. 14 and 15, the suspended lead of the second relay leads 2b4 to 2b9 is cut off by the cutting pin 15A and the die 15B. Simultaneously, the suspended lead of the first relay leads 1b1 to 1b9 is cut off by the cutting pin 15A and die 15B.

Figure 10:
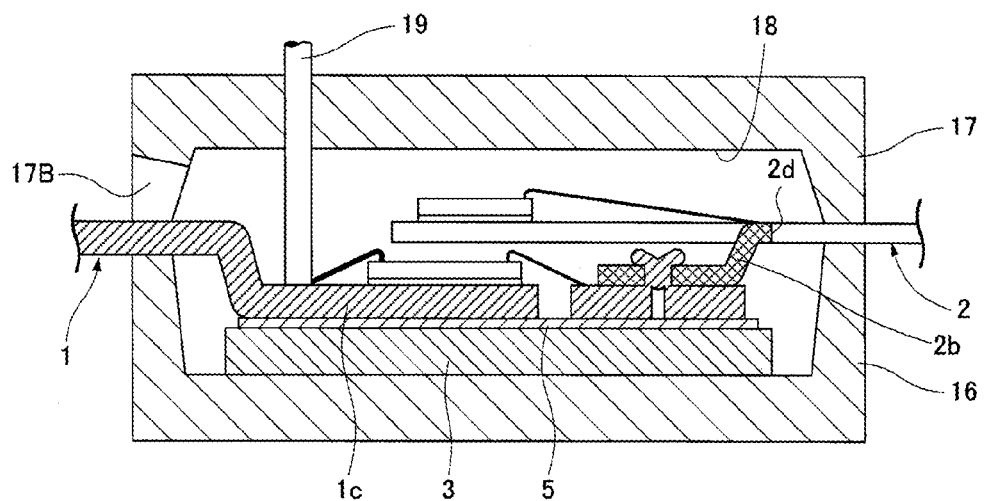
FIG. 10 is a cross sectional view of the semiconductor device in a fifth step according to the first embodiment.

FIG. 10 shows the state of the semiconductor device in the fifth step in FIG. 4.

As shown in FIG. 10, the integrated first lead frame 1 and second lead frame 2 after the fourth step in FIG. 4 are interposed and fixed between the lower mold 16 and the upper mold 17.

Here, gaps caused by the cut-off leads can be narrowed by providing movable mechanisms and so on (not shown) for filling the gaps on the lower mold 16 and the upper mold 17. However, the movable mechanisms for filling the gaps caused by the cut-off leads may be complicated mechanisms since the positions of the suspended leads depend on the type of semiconductor device in some cases.

Figure 11:
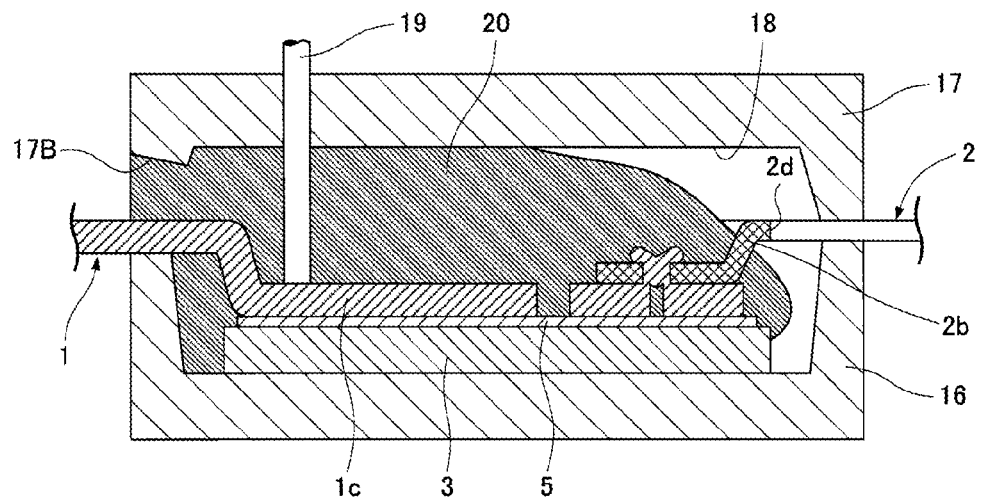
FIG. 11 is a cross sectional view of the semiconductor device in a sixth step according to the first embodiment.

FIG. 11 shows the state of the semiconductor device in the sixth step (molding step) in FIG. 4.

As shown in FIG. 11, a molding resin 20 such as epoxy resin is injected from a gate 17B of the upper mold 17 into a cavity 18 formed between the lower mold 16 and the upper mold 17. The molding resin 20 is injected into the cavity 18 in this way, and the outer package 4 is formed by transfer molding. At this point, the first lead frame 1 is pressed against the lower mold 16 by a mold insertion pin 19 disposed on the side of the gate 17B of the upper mold 17 (the left side of FIG. 11), and thus the molding resin 20 does not leak into the undersurface side of the heat dissipation plate 3 on the side of the gate 17B. In addition, the opposite side of the gate 17B (the right side of FIG. 11) is pressed against the lower mold 16 by the injected molding resin 20, and thus the molding resin 20 does not leak into the undersurface side of the heat dissipation plate 3 on the opposite side of the gate 17B. Therefore, the molding resin 20 is not present on the undersurface side of the heat dissipation plate 3 after resin molding, so that heat dissipation is not deteriorated.

Further, the mold insertion pin 19 is moved up and pulled out of the cavity 18 before the injected molding resin 20 begins hardening. Thereafter, the molding resin 20 hardens, so that the outer package 4 is formed. The adhesive layers of the insulating sheet 5 melt and then cure while the molding resin 20 hardens. Thus, adhesion is strengthened between the insulating sheet 5, the undersurface of the first die pad 1c of the first lead frame 1, and the heat dissipation plate 3.

Finally, the semiconductor device is removed from the cavity 18, thereby accomplishing the resin molding semiconductor device shown in FIGS. 1 to 3. FIG. 12 shows the bottom of the resin molding semiconductor device in which the first and second lead frames 1 and 2 are used as described above.

In the first embodiment, as shown in FIGS. 7 and 8, the cutting pin 15A provided on the holder 12 is lowered toward the die 15B provided on the holder 11 and penetrates through the second lead frame 2 downward so as to cut off the second lead frame 2. The main parts at this point are enlargedly shown in FIGS. 17(a) and 17(b).

In the case where the cutting pin 15A penetrates through the second lead frame 2 downward as shown in FIGS. 7 and 17(a), a warped portion 21 may be formed on the undersurface of the second relay lead 2b as shown in FIG. 17(b). The warped portion 21 is burr at the time of press working.

Figure 17:
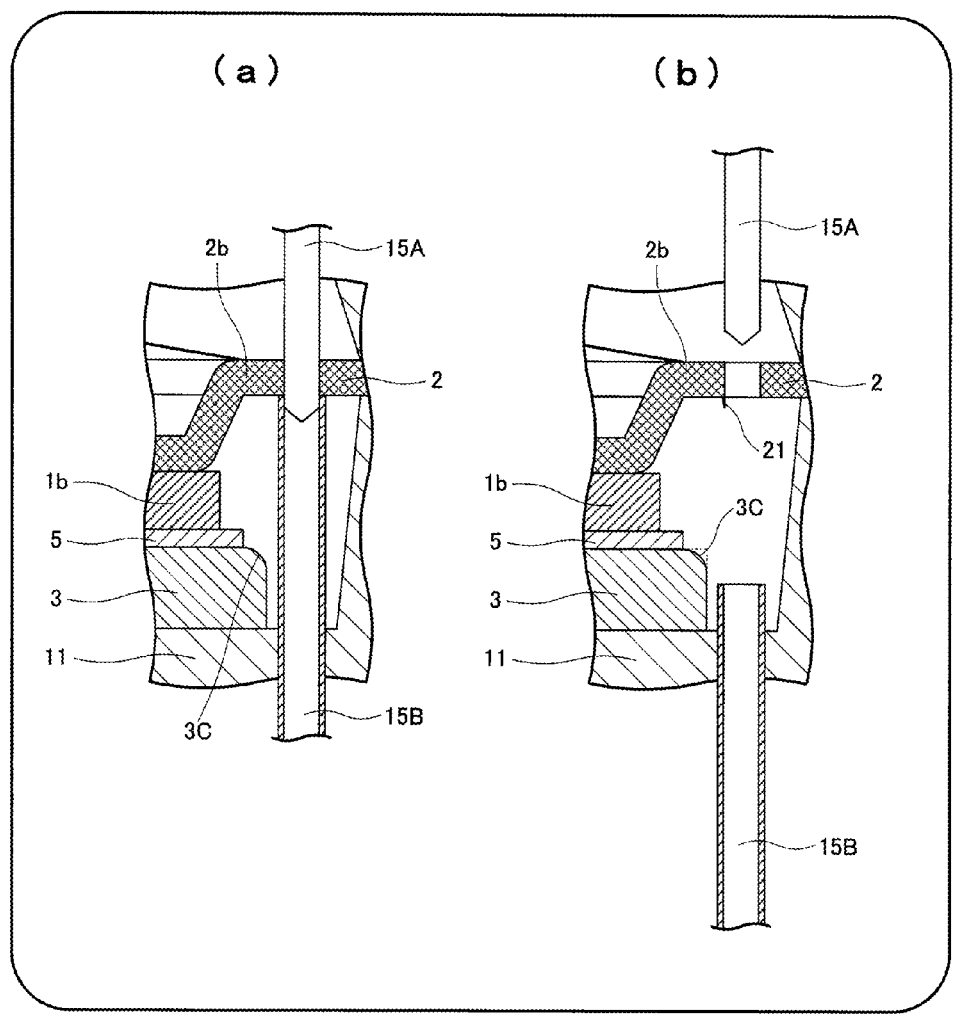
FIG. 17(a) is an enlarged view of the principal part in FIG. 8.
FIG. 17(b) is an explanatory diagram illustrating a warped portion 21 formed on a cut surface.

As shown in FIGS. 17(a) and 17(b), the formed warped portion 21 decreases a creepage distance for insulation between the second relay lead 2b and the heat dissipation plate 3, so that electric field concentration is induced and the possibility of dielectric breakdown increases. Therefore, in the first embodiment, in order to prevent dielectric breakdown due to the formation of the warped portion 21, as shown in FIGS. 17 (a) and 17(b), a corner 3C of the heat dissipation plate 3 is formed as a curved portion having a radius of about 0.1 mm to 0.5 mm, in the vicinity of the end 2d of the second relay lead 2b. In the first embodiment, the curved portion of the corner 3C avoids electric field concentration between the corner 3C of the heat dissipation plate 3 and the warped portion 21 formed in the second relay lead 2b.

Incidentally, in the flow of the first embodiment, the first lead frame 1 is mounted on the heat dissipation plate 3 in the first step of FIG. 5, and the first lead frame 1 is bonded to the heat dissipation plate 3 when caulking in the third step of FIG. 7 and cutting off the leads in the fourth step of FIG. 8. However, the first lead frame 1 may also be mounted on the heat dissipation plate 3 when molding resin is injected in the sixth step of FIG. 11 after cutting off the leads in the fourth step of FIG. 8. The first lead frame 1 is mounted on the heat dissipation plate 3 when injecting molding resin, so that a heat source in the molds (the lower mold 16 and the upper mold 17) can be used for molding with resin and the first lead frame 1 and the heat dissipation plate 3 can be more effectively bonded to each other with heat curing. Further, a heat source provided inside the molds is used, thereby eliminating the need to separately provide a heat source for bonding the first lead frame 1 and the heat dissipation plate 3. In this case, however, the heat dissipation plate 3 as the reference of positioning is not present when caulking and cutting off the leads. Thus, the alignment of the first lead frame 1 and the second lead frame 2 may be complicated.

Comparative Example

Figure 13:
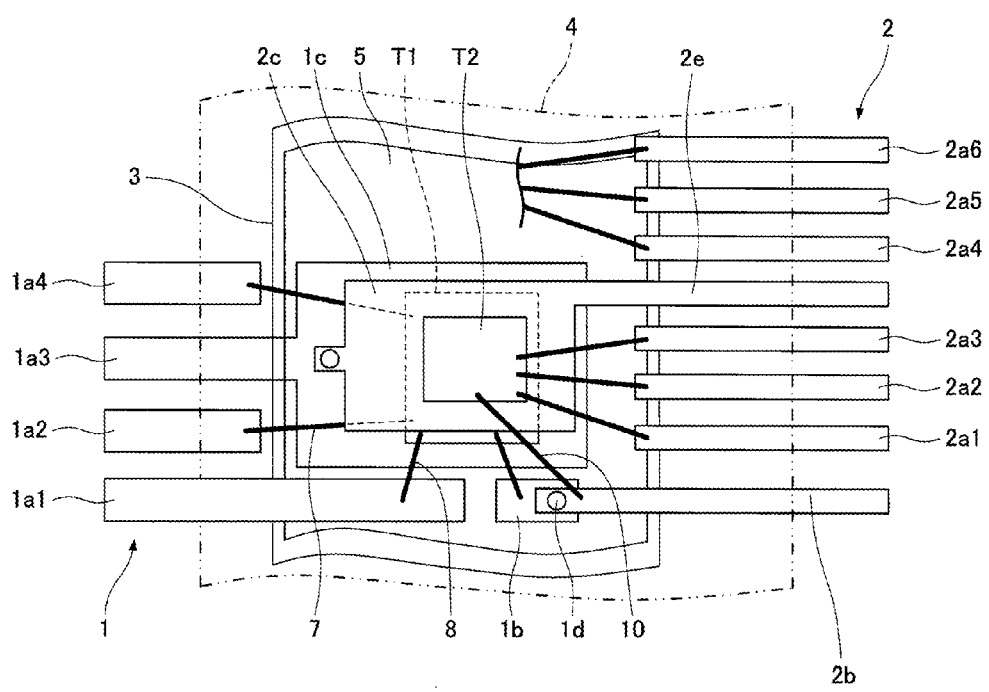
FIG. 13 is a plan view of the interior of a semiconductor device according to a comparative example.

FIG. 13 shows a resin molding semiconductor device as a comparative example.

In the semiconductor device according to the first embodiment of FIG. 1, the end 2d of the second relay lead 2b and the suspended lead 2e of the second die pad 2c are cut off, and are then molded with resin to form the outer package 4. In contrast, in the case of the semiconductor device in the comparative example, an outer package 4 is formed by resin molding without cutting off an end 2d of a second relay lead 2b and a suspended lead 2e of a second die pad 2c. Thereafter, all suspended leads are cut off outside the outer package 4. Thus, the comparative example is different from the first embodiment in the timing of cutting off the second relay lead 2b and the suspended lead 2e.

Accordingly, as shown in FIG. 13, the second relay lead 2b extends beyond the outer package 4 in the case of the semiconductor device of the comparative example.

Here, a comparison is made between the semiconductor device of the first embodiment and the semiconductor device of the comparative example.

In the semiconductor device of the first embodiment, the end of the second relay lead 2b and the suspended lead 2e are cut off before injecting the molding resin 20 to form the outer package 4. Therefore, the end 2d of the second relay lead 2b and the suspended lead 2e are buried in the resin of the outer package 4, and are not drawn or exposed to the outside of the outer package 4. In poor high-moisture use conditions, for example, the reliability of the semiconductor device of the comparative example may be reduced due to moisture and so on entering from the interface between the second relay lead 2b and the outer package 4 and the end surface of the second relay lead 2b into the semiconductor package. In contrast, in the semiconductor device of the first embodiment, there is no interface between the second relay lead 2b and the outer package 4, and the end surface of the second relay lead 2b is located inside the semiconductor package. Therefore, in the semiconductor device of the first embodiment, moisture and so on can be surely prevented from entering the semiconductor package, thereby increasing the reliability of the semiconductor device.

In addition, in the comparative example, an interval between a first external connection lead 1a4 and a first relay lead 1b4 is a creepage distance for insulation. Therefore, the interval between the first external connection lead 1a4 and the first relay lead 1b4 has to be increased in order to increase the creepage distance for insulation.

In contrast, in the semiconductor device of the first embodiment, the creepage distance for insulation between the first external connection lead 1a4 and the first external connection lead 1a5 can be easily secured, since the end 2d of the second relay lead 2b is buried in the resin of the outer package 4 and is not drawn to the outside of the outer package 4. Furthermore, in the semiconductor device of the first embodiment, the first relay leads 1b4 to 1b9 can be disposed concentratedly between the first external connection lead 1a4 and the first external connection lead 1a5. The semiconductor package can be planarly downsized by the concentrated layout as compared to the case where the external connection leads are disposed in other positions.

Second Embodiment

Figure 18:
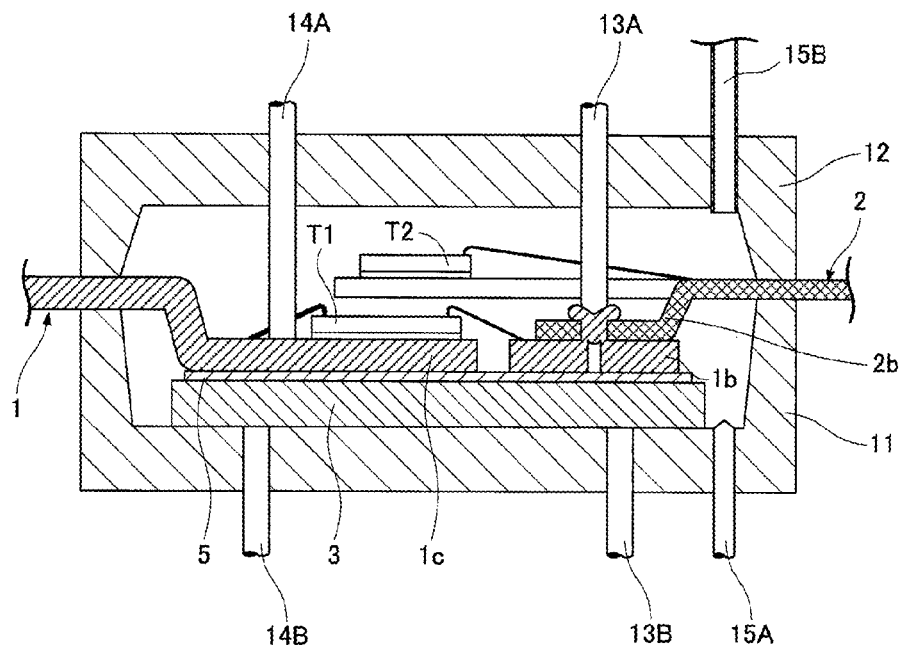
FIG. 18 is a cross sectional view of a semiconductor device in a third step according to a second embodiment of the present invention.
Figure 19:
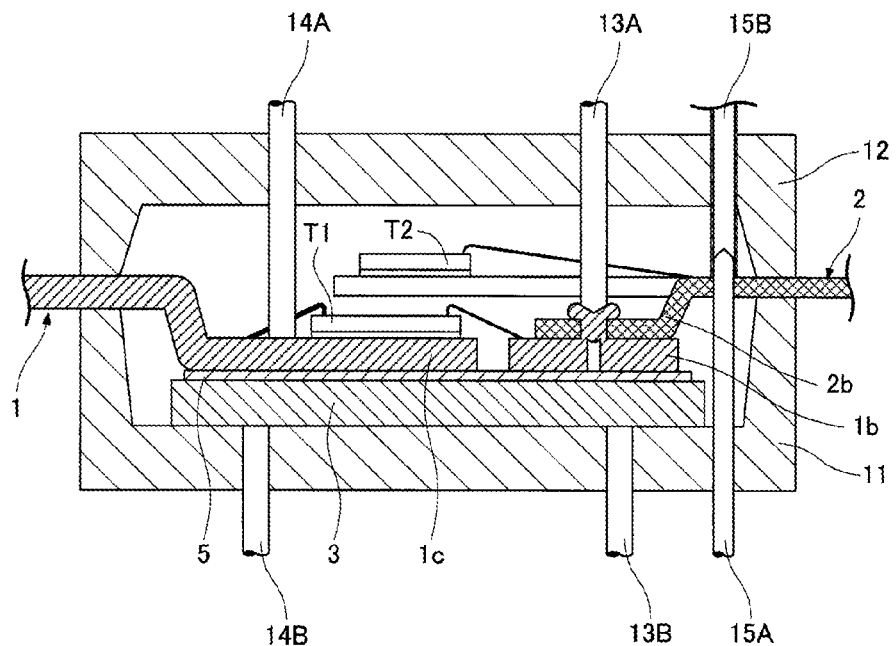
FIG. 19 is a cross sectional view of the semiconductor device in a fourth step according to the second embodiment.

FIGS. 18 to 20 show a second embodiment.

In the first embodiment, as shown in FIGS. 7 and 8, the cutting pin 15A is moved downward so as to penetrate through the second lead frame 2 when cutting off the second relay lead 2b of the second lead frame 2 and so on. However, in the second embodiment, as shown in FIGS. 18 and 19, a cutting pin 15A is moved upward so as to penetrate through a second lead frame 2 when cutting off a second relay lead 2b of the second lead frame 2 and so on. Thus, the second embodiment is different from the first embodiment in the moving direction of the cutting pin 15A when cutting off the second lead frame 2.

In the second embodiment, as shown in FIGS. 20(a) and 20(b), a warped portion 21 is formed on the top surface of the second relay lead 2b whereas the warped portion 21 is formed on the undersurface of the second relay lead 2b in FIG. 17(b) of the first embodiment. In this case, a creepage distance for insulation between the second relay lead 2b and a heat dissipation plate 3 can be increased even if a corner 3C of the heat dissipation plate 3 is not formed as a curved portion having a radius of about 0.1 mm to 0.5 mm. Thus, dielectric breakdown is unlikely to occur.

In each of the above-described embodiments, the first relay lead 1b, the second relay lead 2b, and so on are joined with caulking and thus electrically connected to each other. However, joining methods including welding and deposition may be used if conditions permitted. Specifically, the surfaces of the first relay lead 1b, the second relay lead 2b, and so on may be joined to each other by the following methods of: using ultrasonic waves; pressure welding with heat; interposing a molten material such as solder between the leads; or interposing a resin material such as a conductive adhesive interposed between the leads.

INDUSTRIAL APPLICABILITY

The present invention can be applied to various inverters for air conditioners and so on requiring high electric power control.

The invention claimed is:

1. A semiconductor device comprising:
a resin outer package;
a first lead frame including first relay leads, a first die pad with a first semiconductor chip mounted thereon, and first external connection leads which each have an end protruding from the outer package; and
a second lead frame including a second relay lead, a second die pad with a second semiconductor mounted thereon and a suspended lead, and second external connection leads which each have an end protruding from the outer package, wherein
the outer package seals the first semiconductor chip and the second semiconductor chip,
the first die pad and the second die pad are jointed at a first joint portion, the first relay lead and the second relay lead are jointed at a second joint portion and are electrically connected, and
ends of the second relay lead and ends of the suspended lead are located inside the outer package.

2. The semiconductor device according to claim 1, wherein the first relay lead, the first semiconductor chip, and the first external connection lead are electrically connected, and the second relay lead, the second semiconductor chip, and the second external connection lead are electrically connected.

3. The semiconductor device according to claim 1, wherein the first lead frame and the second lead frame are stacked.

4. The semiconductor device according to claim 1, wherein at least a portion of the first semiconductor chip and at least a portion of the second semiconductor chip are disposed so as to overlap each other in a plan view.

5. The semiconductor device according to claim 1, wherein the first relay lead of the first lead frame and the second relay lead of the second lead frame are jointed to each other with caulking.

6. The semiconductor device according to claim 1, wherein the first relay lead of the first lead frame and the second relay lead of the second lead frame are jointed to each other with surface joining.

7. The semiconductor device according to claim 1, wherein the first relay leads and the first die pad of the first lead frame are coupled to a heat dissipation plate which is partly exposed from a surface of the outer package.

8. The semiconductor device according to claim 1, wherein one of the ends of the second relay lead and one of the ends of the suspended lead are located higher than the first die pad in a thickness direction of the device.

9. The semiconductor device according to claim 1, wherein the second relay lead and the suspended lead are completely embedded in the outer package.

\* \* \* \* \*